United States Patent [19]

Meusburger et al.

[11] 4,027,294
[45] May 31, 1977

[54] COMPENSATION ELEMENT FOR DYNAMIC SEMICONDUCTOR STORES, AND METHOD OF OPERATING THE SAME

[75] Inventors: Güenther Meusburger; Gottfried Wotruba, both of Munich, Germany

[73] Assignee: Siemens Aktiengesellschaft, Berlin & Munich, Germany

[22] Filed: Aug. 25, 1975

[21] Appl. No.: 607,196

[30] Foreign Application Priority Data

Aug. 28, 1974  Germany .......................... 2441243

[52] U.S. Cl. ......................... 340/173 CA; 307/238; 340/173 R
[51] Int. Cl.² .......................................... G11C 7/06
[58] Field of Search ... 340/173 R, 173 CA, 173 FF; 307/238; 357/45

[56] References Cited

UNITED STATES PATENTS

| | | | |
|---|---|---|---|
| 3,774,176 | 11/1973 | Stein et al. | 340/173 CA |
| 3,940,747 | 2/1976 | Kuo et al. | 340/173 CA |
| 3,949,381 | 4/1976 | Dennard et al. | 340/173 CA |

Primary Examiner—David L. Trafton
Attorney, Agent, or Firm—Hill, Gross, Simpson, Van Santen, Steadman, Chiara & Simpson

[57] ABSTRACT

A compensation element and method for operating the same, for use with dynamic semiconductor stores, employing a main storage element operatively connected to a word line and a bit line, and an evaluator circuit operatively connected to the bit line, by means of which the storage element may be read out, comprising the steps of capacitively coupling a correcting voltage to the bit line which may be selectively applied thereto in response to signals on a compensation-selector line operative to control the application of said correcting voltage to the bit line whereby the same is raised to the most favorable middle potential of $U_{BD} = 0.5 \ (U_{BO} + U_{Bl})$, in which $U_{BO}$ = read outvoltage resulting from storage of a binary "0", and $U_{Bl}$ = read out voltage resulting from storage of a binary "1".

4 Claims, 6 Drawing Figures

4,027,294

COMPENSATION ELEMENT FOR DYNAMIC SEMICONDUCTOR STORES, AND METHOD OF OPERATING THE SAME

BACKGROUND OF THE INVENTION

The invention relates to a compensation element for dynamic semiconductor stores and to a method of operating the same.

It is known to increase the sensitivity of regenerator circuits of the type required, for example, for dynamic semiconductor stores with one transistor storage elements, by the utilization of compensation elements. See, for example, the publication by C. Kuo in "Electronics," of Sept. 13, 1973, p. 166 ff entitled "Amplifier Design is Key to 1-Transistor Cell in 4096-bit RAM," which article describes such a circuit.

A disadvantage of this type of circuit resides in the necessity of a substantial outlay in switching elements, supply lines, operating pulse trains and supply voltages.

BRIEF SUMMARY OF THE INVENTION

The present invention, therefore, has as its objective the provision of compensating elements for dynamic semiconductor stores in which the circuit outlay is reduced in comparison to known compensation elements. This objective is achieved by the use of a compensation element and operation thereof in which a correction voltage is capacitatively input-coupled over a compensation capacitor with the voltage on the bit line being raised approximately to the most favorable middle potential between 0 and 1 binary read out voltages with such operation effected over a compensation selector line operatively connected with the compensation capacitor.

In one embodiment of the invention, the compensation capacitor may be connected directly to the bit and compensation-selector lines. In other embodiments, the capacitor may be connected to the bit line by a compensation-selector transistor, which is operatively connected to and controlled by the compensation-selector line. In one form, the electrode of the compensation capacitor, not connected to the compensation-selector transistor, is operatively connected to a line for the supply of respective pulses thereto, and in a further embodiment, such electrode of the capacitor is connected directly to the compensation-selector line.

BRIEF DESCRIPTION OF THE DRAWINGS

In the drawings wherein like reference characters indicate like or corresponding parts, pulses or voltages.

DETAILED DESCRIPTION OF THE INVENTION

Figure 1:
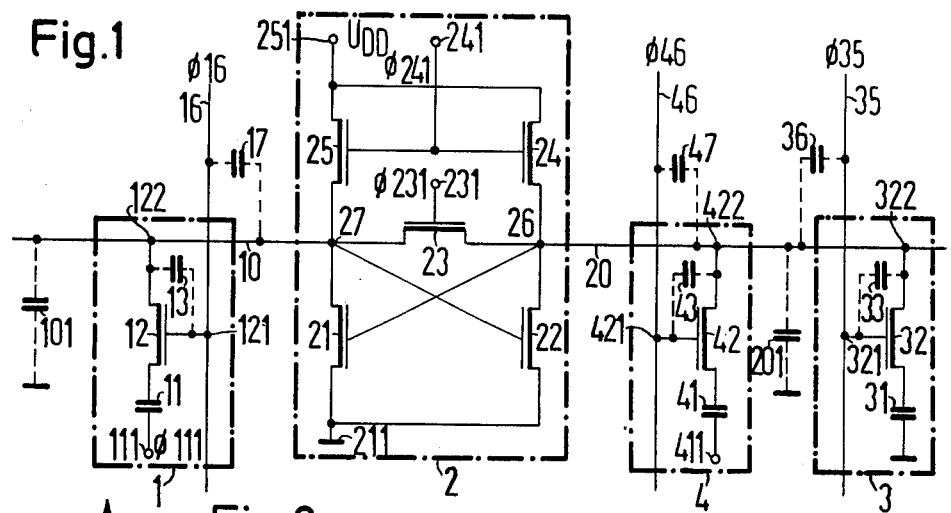
FIG. 1 is a schematic circuit diagram of compensation elements in accordance with the invention, in conjunction with a dynamic semiconductor store for one-transistor storage elements.

Referring to FIG. 1, there is illustrated compensation elements, generally known per se, for a dynamic semiconductor store, preferably composed of one-transistor storage elements, and designated by the reference numeral 3, which comprises a capacitor 31 and a transistor 32, the gate of which is connected to the work line 35 at the point 321. The drain electrode of the transistor 32 is connected to the bit line 20 at the point 322, over which bit line the one-transistor storage element 3 is connected to an evaluator circuit 2. The evaluator circuit 2, for example, may comprise a flip-flop circuit, known per se. In the example of FIG. 1, the flip-flop circuit comprises switching transistors 21 and 22 and load transistors 25, 24, with the transistors 24, 25 serving as load elements which may be operated in common from terminal point 241 which is connected to the gates of the respective transistors. The supply voltage $U_{DD}$ is applied between the terminal points 211 and 251 of the flip-flop circuit. The bit line 20 is connected to the node 26 of the flip-flop, and the bit line 10 which is connected to another one-transistor storage element, not illustrated in FIG. 1, is connected to the node 27 of the flip-flop. Preferably the nodes 26 and 27 are connectable to one another over a transistor 23, which is operable in dependence upon voltage applied to the terminal point 231 which is connected to the transistor gate.

The compensation elements 1 and 4 are arranged, in known manner, on the bit lines 10 and 20. Each of such compensation elements comprises a capacitor and a transistor, the compensation element 1 comprising a compensation capacitor 11 which is connected at one side or electrode to the source terminal of a compensation-selector transistor 12 and the opposite side or electrode thereof connected to a terminal 111. The gate terminal of the compensation-selector transistor 12 is connected to the compensation-selector line 16 at the point 121, while the drain of such transistor is connected to the bit line 10 at point 122.

In like manner, the compensation element 4 comprises a compensation-selector transistor 42, the gate of which is connected to the compensation-selector line 46 at point 421 and the drain terminal of the transistor 42 is connected to the bit line 20 at point 422. The electrode of the capacitor 41 not connected to the source electrode of the transistor 42 is in accordance with the invention, connected to terminal point 411.

The transistors preferably are in the form of field effect transistors, particularly MOS-transistors.

In previously known compensation elements, corresponding terminal points 111 and 411 are each permanently connected to ground potential.

The operation of the circuit of FIG. 1, in accordance with the present invention, will be described in connection with FIG. 2. At the time $t_0$, the bit lines 10 and 20 are pre-charged to the reference potential $U_{ref}$. In the evaluator circuit 2, the potential $U_{ref}$ is governed by the start voltage of the switching transistors 21 and 22, which potential is generally asymmetrical with respect to the voltages $U_{B1}$ and $U_{B0}$ appearing on the bit lines at the time $t_4$ following the read out operation. In this connection, the potential $U_{B1}$ is the voltage occurring when an item of binary 1 data is read out and $U_{B0}$ is the potential which appears when an item of binary 0 data is read out. At the time $t_1$, the transistors 12 and 42 of the compensation elements 1 and 4 respectively are switched into a conductive state by the application of potentials φ 16 and φ 46 applied to the compensation selector lines 16 and 46, thereby insuring that the capacitors 11 and 41 are pre-charged to the reference potential $U_{ref}$ on the bit line 10, 20.

At the time $t_2$, the shunt transistor 23 is blocked as a result of potential φ 231 being removed from terminal 231, and thus from the gate of transistor 23. The bit lines 10 and 20 are now electrically cut off from one another and the reference state of the evaluator circuit is thus set.

Upon read out of the data from the storage element, in accordance with the invention, the compensation element connected to the bit line at the opposite side of the flip-flop to the storage element, is now additionally selected. For example, if the data of the one-transistor storage element 3 of FIG. 1 is to be read out, at the time $t_4$, the selector pulse φ 35 is connected to the word line 35, whereby the transistor 32 of the storage element 3 is switched conductive. In accordance with the data stored in the storage element, a voltage increment ΔU now appears on the bit line 20, and assuming that a binary 1 is stored, such a potential will be positive, and which is illustrated in FIG. 2. Due to the parasitic coupling capacitances designated by the reference characters 36 and 33, when the pulse train φ 35 is applied, an additional parasitic signal voltage δU is input-coupled onto the bit line 20. As illustrated in the figure, at the time $t_4$, in accordance with the invention, by means of a selector pulse train φ 16 and the parasitic capacitances of the compensation element 13 and 17 an equal parasitic voltage δU is input-coupled onto the bit line 20. As a symmetrical flip-flop is insensitive to symmetrical input interferences, the parasitic signal voltage is thereby compensated.

At the time $t_5$, the pulse train φ 111 is connected to a terminal 111 of the capacitor 11 of the compensation element 1, and by capacitive coupling the bit line 10 is brought to the most favorable middle potential $U_{BD}$ = 0.5 $(U_{B0} + U_{B1})$. In the above equation $U_{B0} = U_{ref} - \Delta_U$ and $U_{B1} = U_{ref} + \Delta_U$.

The amplitude of pulse train φ 111 is calculated in accordance with the following formula:

$$\phi_{111/411} = \frac{(C_{101/201} + C_{11/41}) \cdot [0.5 (U_{B0} + U_{B1}) - U_{ref}]}{C_{11/41}}$$

In this formula $C_{101/201}$ represents the capacitance of the bit line. In the Figure this capacitance for the bit line 10 is schematically indicated by the capacitance 101 and that for the bit line 20 is schematically represented by the capacitance 201.

Figure 2:
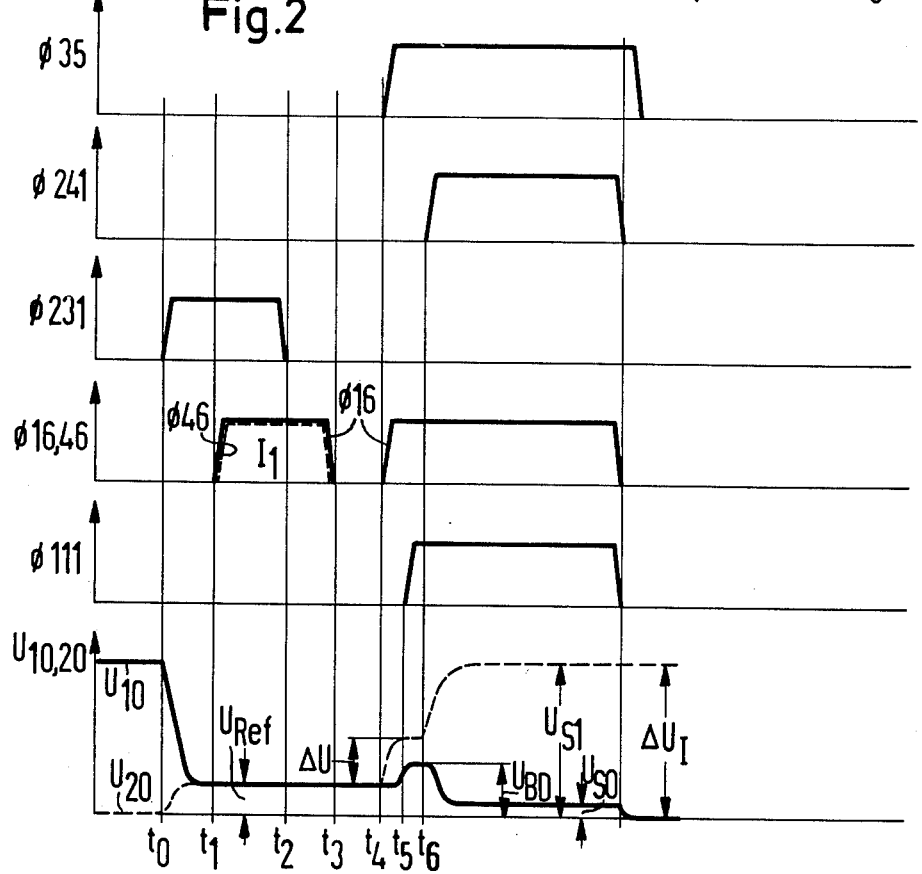
FIG. 2 is a chart illustrating the pulse-train sequential program for the circuit illustrated in FIG. 1.

The flip-flop is activated at the time $t_6$ and as illustrated in FIG. 2 is effected by the connection of pulse train φ 241 to the terminal 241, whereby the flip-flop triggers into a state corresponding to the read out information.

As a result of the disconnection of the pulse train φ 241 at the time $t_7$, the bit line capacitance 101, which has been previously charged to a potential $U_{S0}$, can be discharged over the transistor 21 to 0 V, so that the potential interval between the data potential $\Delta_{U1} = U_{S1} = U_{S0}$ is further increased.

Advantageously, in the operation of the compensating element, the amplitude of the compensation pulse train φ 111 is so selected that it is equal to the amplitude of a pulse train initially required for the evaluation circuit 2, for example equal to the amplitude of the pulse train φ 35. The compensation capacitor 11 as well as the capacitor 41 is designed in accordance with the above formula, in which case:

$$C_{11/41} = \frac{C_{101/201} \cdot [0.5 \cdot (U_{B0} + U_{B1}) - ]U_{ref}]}{\phi_{114/411} - [0.5 (U_{B0} + U_{B1}) - U_{ref}]}$$

In another advantageous type of operation, the pulse I 1, illustrated in FIG. 2, may be applied simultaneously with the pulse train φ 231, in which case the respective time $t_0$, $T_1$ and $t_2$, $t_3$ in each case coincide.

Figure 3:
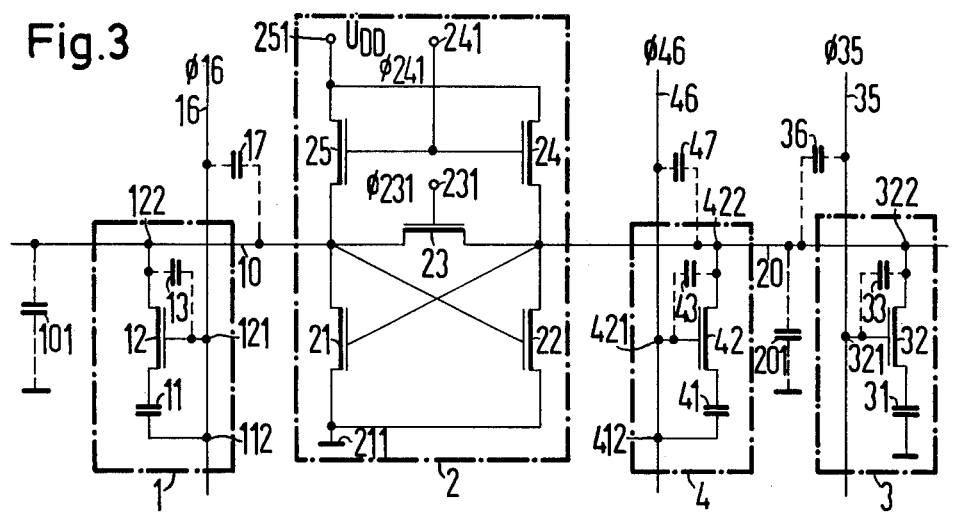
FIG. 3 is a schematic circuit diagram similar to FIG. 1, illustrating a modification of the circuit thereof.

FIG. 3 illustrates a modification of the circuit of FIG. 1 in which the terminals, of the respective capacitors 11 and 41, identified by the reference numerals 111 and 411 in FIG. 1 are connected directly to the compensation-selector lines 16 and 46. The electrode of the capacitor 11, not connected to the source terminal of the transistor 12, is connected to the compensation-selector line 16 at the point 112, while the corresponding electrode of the capacitor 41, i.e. not connected to the source electrode of the transistor 42, is connected to the compensation-selector line 46 at the point 412. The primary advantage of this circuit, in accordance with the invention, resides in the simple compensation of the parasitic signal voltage δ U due to the possibility of the accurate simulation of the selector transistor 32 of the storage element 3 when only one pulse-train line is used per compensation element. In this embodiment, the compensation elements 1 and 4 are pre-charged before the shunt transistor 23 is switched conductive which, in the chart of FIG. 4, corresponds to the time interval of $t_0'$, to $t_1'$. When the compensation-selector transistors 12 and 42 are switched conductive, the voltage of the bit line 10, 20 is connected to the compensation capacitors 11 and 41, and when the pulse trains φ 16 and φ 46 are disconnected at time $t_3'$, as a result of capacitive coupling, in accordance with the capacitive ratio $$\frac{C_{11/41}}{C_{11/41} + C_{101/201}} < 1,$$

the potential $U_{11}$ and $U_{41}$ connected to the compensation capacitors 11 and 41 will fall more slowly than the amplitude of the pulse trains φ 16 and φ 46 across the gates of the transistors 12 and 42. When the difference in the two potentials φ 16 − $U_{11}$ and φ 46 − $U_{41}$ reaches the value of the start voltage $U_T$ of the transistors 12 and 42, these transistors are blocked and the charge of the compensation capacitor 11 and 41 remains stored. When the pulse trains φ 16 and φ 46 are disconnected after the time $t_3'$, the voltage $U_T$ is accordingly connected to the capacitors 11 and 41. Following the disconnection of the pulse trains φ 16/46 the difference in the potentials φ 16/46 − $U_{11/41}$ is greater than the start voltage $U_T$, whereby the compensation capacitors 11, 41 are charged from the parasitic bit line capacitances 101 and 102, until the compensation-selector transistors 12 and 42 block. The compensation-capacitors 11 and 41 are thus again charged to −$U_T$.

The amplitude of the selector pulses φ 16/46 is calculated in accordance with a pre-charge voltage of the compensation capacitors 11, 41 of −$U_T$ and a parasitic bit line capacitance 101, 201, as follows:

$$\phi_{16/46} = U_{ref} + U_T + \frac{(C_{101/201} + C_{11/41}) \cdot [0.5 \cdot (U_{B0} + U_{B1}) - U_{ref}]}{C_{11/41}}$$

The compensation capacitors 11, 41 are designed in accordance with the following equation:

$$C_{11/41} = \frac{C_{101/201} [0.5 (U_{B0} + U_{B1}) - U_{ref}]}{\phi_{16/46} - U_T - [0.5 (U_{B0} + U_{B1})]}$$

In this case the primary advantage is that only one supply line is required for each compensation element 1, 4.

Figure 4:
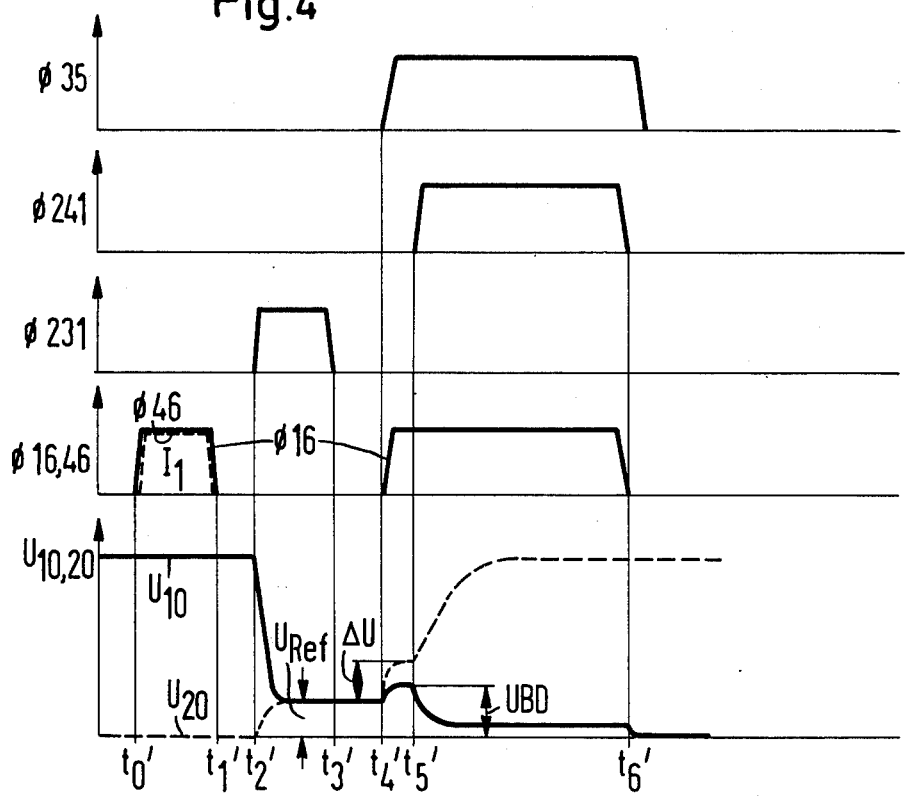
FIG. 4 is a chart similar to FIG. 2, for the circuit of FIG. 3.

As will be apparent from reference to FIG. 4, the same pulse train program is utilized with this circuit as with the circuit of FIG. 1 with the elimination of pulse trains $\phi$ 11 and $\phi$ 411. This embodiment has the particular advantage of ready adaptability to metal-gate techniques.

Figure 5:
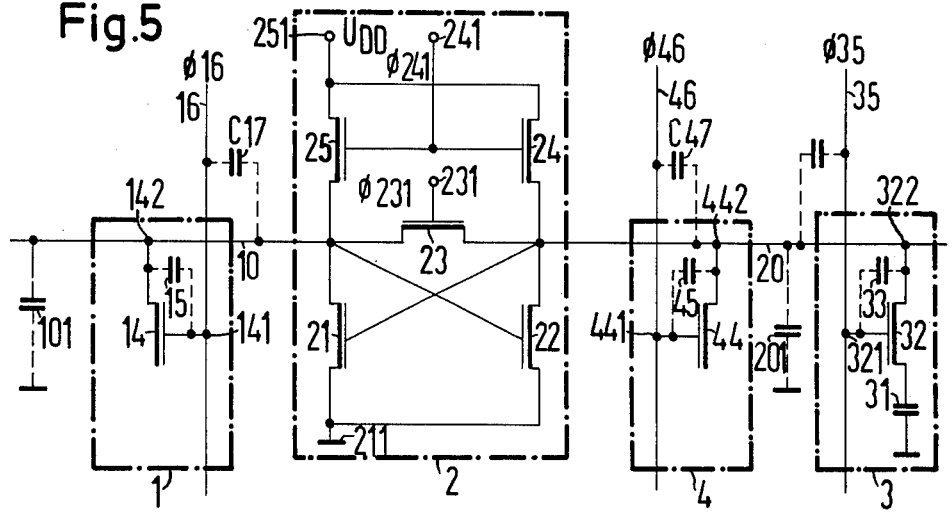
FIG. 5 is a schematic circuit diagram, similar to FIGS. 1 and 3 illustrating a further modification of the invention.

In accordance with a further development of the invention, as illustrated in FIG. 5, the compensation elements 1, 4 may comprise respective capacitors 14, 44, over which, through selective capacitive coupling, the middle potential, which is so important for the satisfactory functioning of the regenerator circuit, is produced on the bit line 10, 20. As in the previously described exemplary embodiments of the invention, by appropriate dimensioning of the compensation element, compensation is ensured of the parasitic voltage pulse $\delta U$ occurring on the bit line upon the selection of a storage element, by the parasitic capacitances of the compensation elements $C_{17}$ and $C_{47}$ and a corresponding component $C_{15}$, $C_{45}$ on the compensation capacitance 14, 44. Operation corresponds substantially to that of the circuit of FIG. 3.

Figure 6:
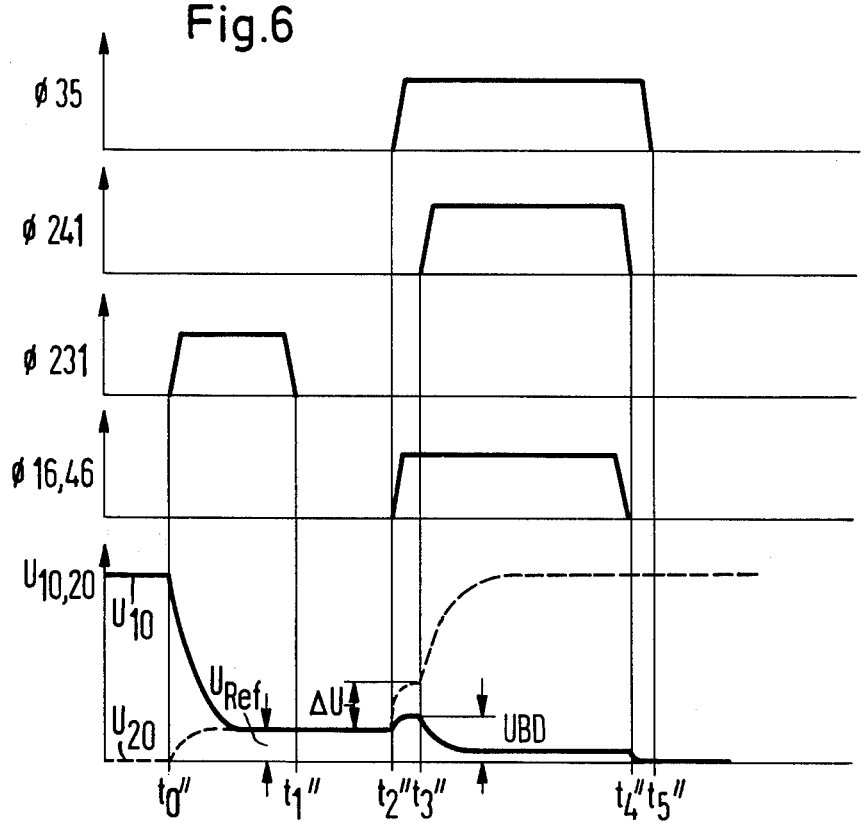
FIG. 6 is a chart similar to FIGS. 2 and 4, for the circuit of FIG. 5.

A particular advantage of the circuit of FIG. 5 is the elimination of pulse $I_1$ which is required in the operation of the respective circuits of FIGS. 2 and 4. As will be apparent from reference to FIG. 6, in the time period between $t_0''$ and $t_1''$, the reference potential $U_{ref}$ appears on the bit line 10, 20. Upon selection of the word line 35 at the time $t_2''$ (pulse $\phi$ 35) the opposite compensation selector line 16 is simultaneously selected (pulse $\phi$ 16). The amplitude of the pulse train $\phi$ 16, required to apply the most favorable middle potential $U_{BD}$ is calculated in accordance with the following:

$$\phi_{16/46} = U_{TD} + U_{ref} + \frac{C_{101/201} + C_{14/44}}{C_{14/44}} \cdot [0.5 (U_{B0} + U_{B1}) - 9 U_{ref}]$$

In this equation, $U_{TD}$ is the start voltage of the compensation capacitance 14, 44 when the latter is in the form of a MOS capacitance.

The compensation capacitance $C_{14/44}$ is thus calculated in accordance with the following:

$$C_{14/44} = \frac{C_{101/201} [0.5 (U_{B0} + U_{B1}) - U_{ref}]}{\phi_{16/46} - U_{TD} - [0.5 (U_{B0} + U_{B1})]}$$

In addition to the simple operation involved, in this embodiment of the invention the compensation element of FIG. 5 possesses the advantage of having very small area or space requirements.

It will be noted from the above examples that the equations for determination of the capacitance of the compensation capacitor, involves the effective voltage of the compensation pulse train applied to the capacitor. In the example of FIG. 1 this corresponds to the pulse train $\phi$ 111, 411, while in the examples of FIGS. 3 and 5, the start voltage of the compensation-selector transistor or of the compensation capacitor, when the latter is in the form of a MOS capacitance, must also be taken into consideration. Thus the equation with respect to FIG. 3 involves the value $\phi$ 16, 46 $- U_T$ where $U_T$ is the start voltage of the transistors 16, 46, and the equation with respect to FIG. 5 involves the value $\phi$ 16, 46 $- U_{TD}$ where $U_{TD}$ is the start voltage of the compensation capacitor when the latter is in the form of a MOS capacitance. The effective value for the three examples thus may be designated $\phi_N$, and the three equations may be generically written as follows:

$$C_C = \frac{C_A [0.5 (U_{B0} + U_{B1}) - U_{ref}]}{\phi_N - [0.5 (U_{B0} + U_{B1}) - {}_{ref}]}$$

in which $C_C$ = compensation capacitance; $C_A$ = the bit line capacitance; and $\phi_N$ the effective voltage of the compensation pulse train applied to the capacitor. Thus applying the equation to FIG. 1, $\phi_N + \phi_{CP}$, where $\phi_{CP}$ is the value of the correcting voltage applied to the capacitor, i.e. $\phi_{111, 411}$. In the circuit of FIG. 3, $\phi_N = \phi_{SP} - U_T - V_{ref}$, where $\phi_{SP}$ is the value of the selector pulse train on the lines 16, 46, and $U_T$ is the starting voltage of the transistor. In the circuit of FIG. 5, it may be considered, for the purposes of the equation, that $\phi_N = \phi_{SP} - U_{ref} - U_{TD}$, where $U_{TD}$ is the starting voltage of the MOS capacitance.

The evaluator circuit identified by the reference numeral 2 in FIGS. 1, 3 and 5 can be replaced by other evaluator circuits.

Having thus described our invention it will be obvious that although various minor modifications might be suggested by those versed in the art, it should be understood that we wish to embody within the scope of the patent granted hereon all such modifications as reasonably, and properly come within the scope of our contribution of the art.

What is claimed is:

1. A compensation storage element for dynamic semiconductor stores in which a main storage element is operatively connected to a word line and a bit line, and an evaluation circuit is operatively connected to the bit line by means of which the storage element may be read out, comprising a compensation capacitor, having one side thereof connected to the bit line at the opposite side of the evaluation circuit to which the storage element is connected, means including a compensation-selector line operatively connected to the other side of the compensation capacitor for controlling the application of a selector pulse train thereto, the compensation capacitor being dimensioned in accordance with the following equation:

$$C_C = \frac{C_A [0.5 (U_{B0} + U_{B1}) - U_{ref}]}{\phi_N - [0.5 (U_{B0} + U_{B1}) - {}_{ref}]}$$

in which $C_C$ = compensation capacitance, $C_A$ = bit line capacitance, $\phi_N$ = effective value of the pulse train applied to the compensation capacitor, $U_{ref}$ = reference voltage, and $U_{B0}$ and $U_{B1}$ = read out voltage for binary 0 or 1 respectively, whereby the correcting voltage applied to the bit line is raised to the most favorable middle potential of $U_{BD} = 0.5 (U_{B0} + U_{B1})$.

2. A compensation storage element according to claim 1, wherein said compensation capacitor has one side thereof connected to the source of a compensation-selector transistor which has its drain connected to the bit line and its gate connected to the compensation-selector line, the compensation capacitor having the other side thereof connected to a correcting voltage in the form of a pulse train, the capacitive application thereof to the bit line being controlled by a pulse train on said compensation-selector line, said compensation capacitor being dimensioned in accordance with the following equation:

$$C_C = \frac{C_A \cdot [0.5\,(U_{B0} + U_{B1}) - U_{ref}]}{\phi_{CP} - [0.5\,(U_{B0} + U_{B1}) - U_{ref}]}$$

in which $\phi_{CP}$ = value of the correcting voltage pulse train applied to the compensation capacitor.

3. A compensation storage element according to claim 1, wherein said compensation capacitor has one side thereof connected to the source of a compensation-selector transistor which has its drain connected to the bit line and its gate connected to the compensation-selector line, the compensation capacitor having the other side thereof connected to the bit line, said compensation capacitor being dimensioned in accordance with the following equation:

$$C_C = \frac{C_A \cdot [0.5\,(U_{B0} + U_{B1}) - U_{ref}]}{\phi_{SP} - U_T - [0.5\,(U_{B0} + U_{B1})]}$$

in which $\phi_{SP}$ = value of the selector pulse train, and $U_T$ = starting voltage of the compensation-selector transistor.

4. A compensation storage element according to claim 1, wherein said compensation capacitor is in the form of a MOS capacitance, and has one side thereof connected to the bit line and the other side thereof connected to the compensation selector line, said compensation capacitor being dimensioned in accordance with the following equation:

$$C_C = \frac{C_A \cdot [0.5\,(U_{B0} + U_{B1}) - U_{ref}]}{\phi_{SP} - U_{TD} - [0.5\,(U_{B0} + U_{B1})]}$$

in which $\phi_{SP}$ = value of the selector pulse train, and $U_{TD}$ = starting voltage of the MOS capacitance.

* * * * *